(12) United States Patent
Jau et al.

(10) Patent No.: US 9,167,718 B2
(45) Date of Patent: Oct. 20, 2015

(54) SERVER SYSTEM

(75) Inventors: Maw-Zan Jau, Taipei (TW); Tzu-Hung Wang, Keelung (TW)

(73) Assignee: Quanta Computer Inc., Tao Yuan Shien (TW)

( * ) Notice: Subject to any disclaimer, the term of this patent is extended or adjusted under 35 U.S.C. 154(b) by 336 days.

(21) Appl. No.: 13/480,815

(22) Filed: May 25, 2012

(65) Prior Publication Data

US 2013/0227309 A1 Aug. 29, 2013

(30) Foreign Application Priority Data

Feb. 29, 2012 (TW) .............................. 101106594 A

(51) Int. Cl.
*G06F 1/26* (2006.01)
*H05K 7/14* (2006.01)

(52) U.S. Cl.
CPC .................................. *H05K 7/1492* (2013.01)

(58) Field of Classification Search
CPC ............ G06F 1/263; G06F 1/28; G06F 1/30; G06F 11/2015; H02J 2009/068; Y02B 60/1292; Y04S 20/248; H05K 7/1492
USPC .................................................. 713/300, 340
See application file for complete search history.

(56) References Cited

U.S. PATENT DOCUMENTS

| | | | | |
|---|---|---|---|---|
| 4,860,185 A * | 8/1989 | Brewer et al. | .................. | 363/41 |
| 5,602,462 A * | 2/1997 | Stich et al. | ...................... | 323/258 |
| 5,914,585 A * | 6/1999 | Grabon | .......................... | 320/125 |
| 6,035,358 A * | 3/2000 | Tanikawa | ..................... | 710/310 |
| 6,509,657 B1 * | 1/2003 | Wong et al. | ...................... | 307/66 |
| 6,741,896 B1 * | 5/2004 | Olzak et al. | ...................... | 700/82 |
| 7,143,298 B2 * | 11/2006 | Wells et al. | .................... | 713/300 |
| 7,330,990 B2 | 2/2008 | Sato et al. | | |
| 7,560,831 B2 * | 7/2009 | Whitted et al. | ................. | 307/64 |
| 2003/0220026 A1 * | 11/2003 | Oki et al. | ...................... | 439/894 |
| 2005/0146223 A1 * | 7/2005 | Kanouda et al. | ............... | 307/66 |
| 2005/0162830 A1 * | 7/2005 | Wortman et al. | ............. | 361/695 |
| 2006/0221751 A1 * | 10/2006 | Chiao et al. | ................... | 365/229 |
| 2007/0025090 A1 | 2/2007 | Belady | | |

(Continued)

FOREIGN PATENT DOCUMENTS

| | | |
|---|---|---|
| TW | 549749 | 8/2003 |
| TW | M335724 | 7/2008 |
| TW | 201044748 | 12/2010 |

OTHER PUBLICATIONS

PA3GMP, Adjusting charging voltage of APC Smart-UPS 500, May 13, 2006, http://www.eham.net/ehamforum/smf/index.php?topic=48589.0.*

(Continued)

*Primary Examiner* — Mark Connolly
(74) *Attorney, Agent, or Firm* — Novak Druce Connolly Bove + Quigg LLP

(57) ABSTRACT

A server system is disclosed. The server system comprises a motherboard and a server power system. The server power system comprises a power transmission interface, a power supply, a battery backup unit (BBU) and a signal transmission interface. The power supply converts an AC power into a DC power and then outputs the DC power to the motherboard via the power transmission interface. The BBU provides parallel or redundant power to the motherboard via the power transmission interface. The BBU and the power supply have the same size. The signal transmission interface is electrically connected to the motherboard, the power supply and the BBU.

10 Claims, 4 Drawing Sheets

(56) References Cited

U.S. PATENT DOCUMENTS

| | | | |
|---|---|---|---|
| 2009/0049322 A1* | 2/2009 | Chang | 713/340 |
| 2009/0164820 A1* | 6/2009 | Abraham | 713/323 |
| 2010/0064161 A1 | 3/2010 | Chen | |
| 2010/0270863 A1 | 10/2010 | Togare | |
| 2010/0332857 A1* | 12/2010 | Vogman | 713/300 |
| 2011/0018342 A1* | 1/2011 | Park et al. | 307/23 |
| 2011/0133559 A1 | 6/2011 | Yamashita et al. | |
| 2012/0013186 A1* | 1/2012 | Sarti | 307/23 |
| 2013/0119768 A1* | 5/2013 | Chang | 307/66 |
| 2013/0184891 A1* | 7/2013 | Etaati | 700/295 |
| 2013/0193764 A1* | 8/2013 | Bailey et al. | 307/66 |
| 2013/0275777 A1* | 10/2013 | Shih et al. | 713/300 |
| 2014/0070616 A1* | 3/2014 | Shih et al. | 307/64 |

OTHER PUBLICATIONS

English abstract for TW201044748; published on Dec. 16, 2010 and retrieved Sep. 16, 2014.

English abstract for TW549749; published on Aug. 21, 2003.

English abstract for TWM335724; published on Jul. 1, 2008 and retrieved on Sep. 16, 2014.

Office Action mailed Jun. 16, 2014; in corresponding Taiwanese patent application No. 101106594.

First Office Action mailed on Apr. 24, 2015 in Chinese Application No. 201210079685.4.

English Summary of First Office Action mailed on Apr. 24, 2015 in Chinese Application No. 201210079685.4.

* cited by examiner

SERVER SYSTEM

This application claims the benefit of Taiwan application Serial No. 101106594, filed Feb. 29, 2012, the subject matter of which is incorporated herein by reference.

BACKGROUND OF THE INVENTION

1. Field of the Invention

The invention relates in general to a computer system, and more particularly to a server system.

2. Description of the Related Art

Referring to FIG. 1, an architecture diagram of a conventional server system is shown. The conventional server system 1 comprises a motherboard 11 and a server power system 12. The server power system 12 comprises a number of power supplies 122 for converting an AC power VAC into a DC power VDC and outputting the DC power to a circuit board 11. The reason for employing plural power supplies 122 is to assure that when one of the power supplies 122 breaks down, the other power supplies 122 may provide a backup power supply to maintain the normal operation of the server system 1. However, when the AC power VAC is disconnected or the power line comes off the connection, the conventional server system 1 still cannot be exempted from power failure.

SUMMARY OF THE INVENTION

The invention is directed to a server system.

According to an embodiment of the present invention, a server system is disclosed. The server system comprises a motherboard and a server power system. The server power system comprises a power transmission interface, a power supply, a battery backup unit (BBU) and a signal transmission interface. The power supply converts an AC power into a DC power and then outputs the DC power to the motherboard via the power transmission interface. The BBU provides parallel or redundant power to the motherboard via the power transmission interface. The BBU and the power supply have the same size. The signal transmission interface is electrically connected to the motherboard, the power supply and the BBU.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 1:
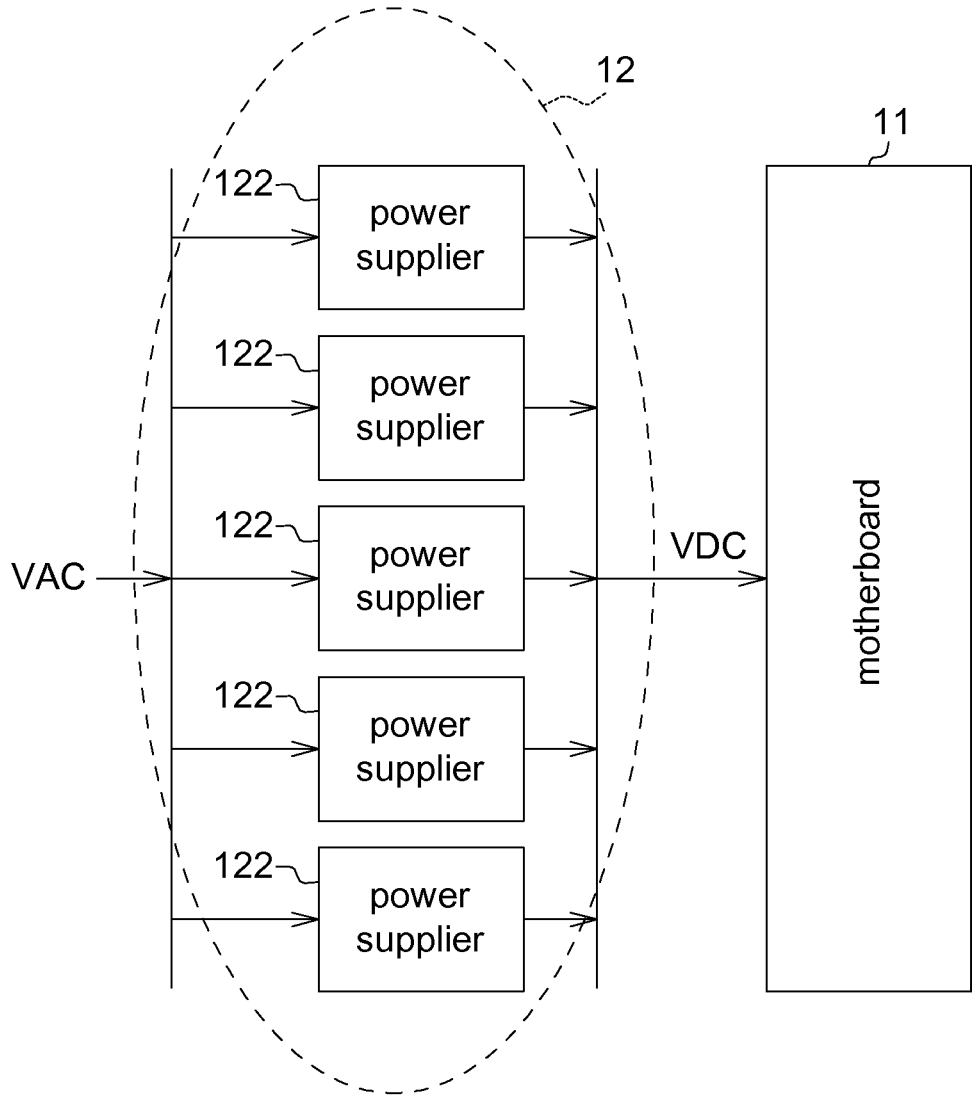
FIG. 1 shows an architecture diagram of a conventional server system.
Figure 2:
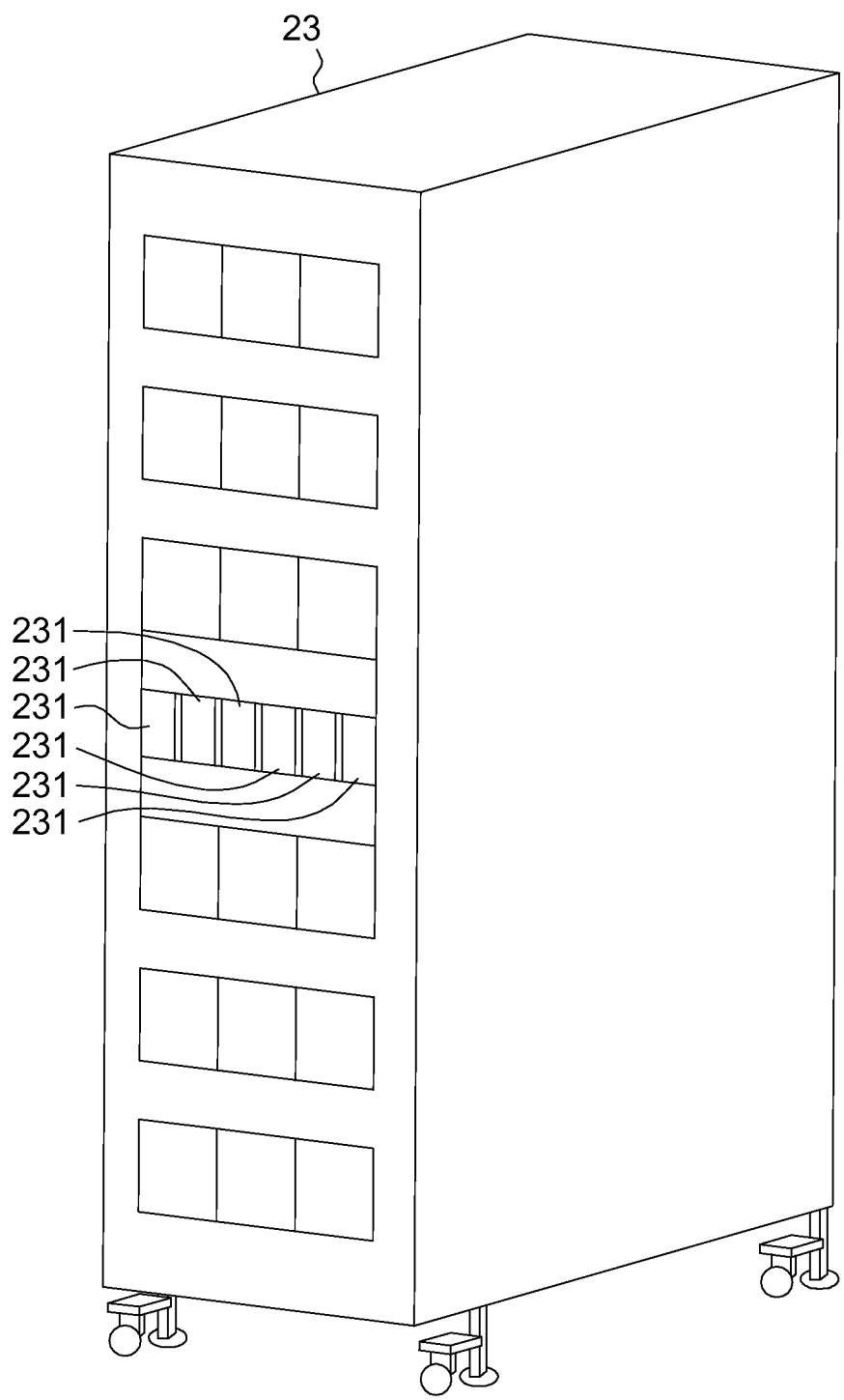
FIG. 2 shows an appearance diagram of a server system according to a first embodiment.
Figure 3:
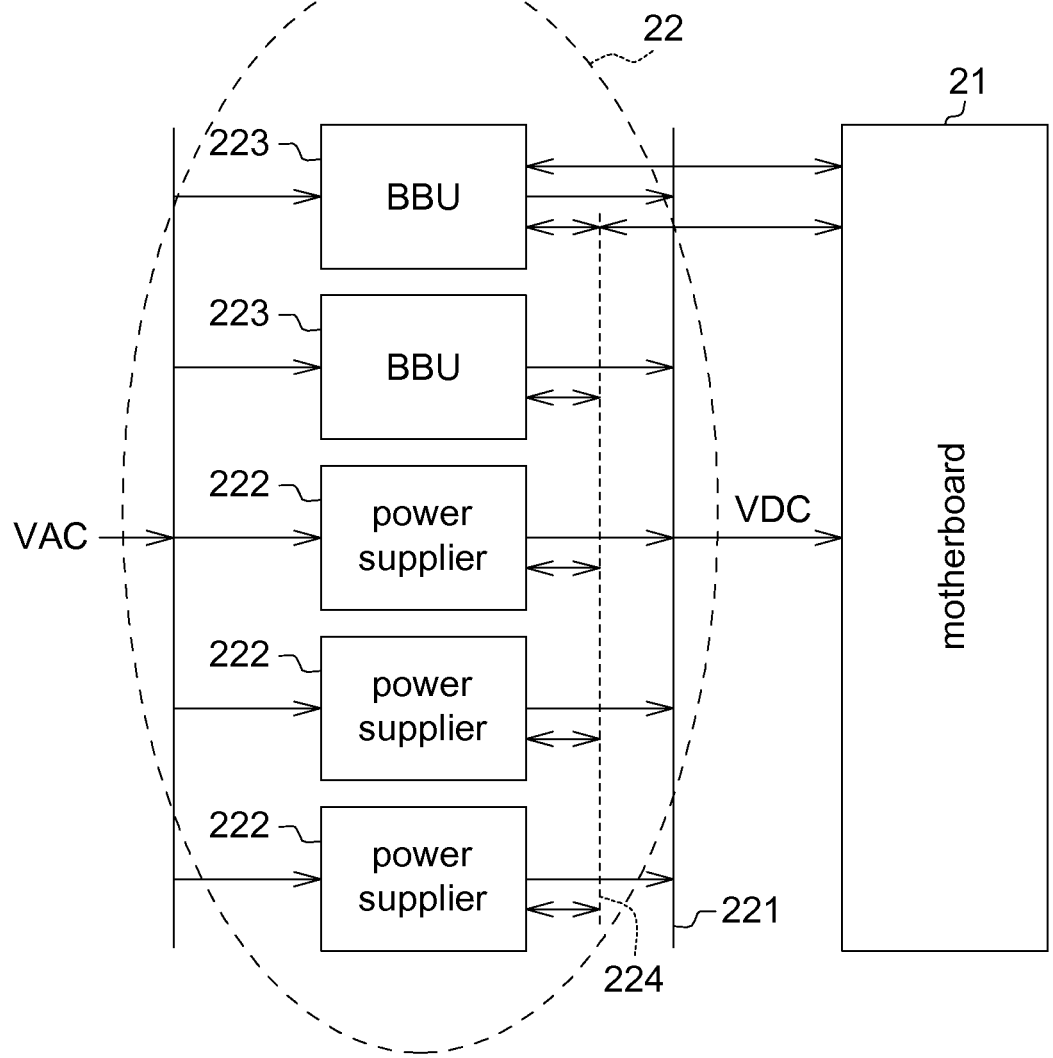
FIG. 3 shows an architecture diagram of a server system according to a first embodiment.

Referring to both FIG. 2 shows an appearance diagram of a server system according to a first embodiment. FIG. 3 shows an architecture diagram of a server system according to a first embodiment. The server system 2 comprises a motherboard 21, a server power system 22 and a server rack 23. The server power system 22 comprises a power transmission interface 221, a power supply 222, a battery backup unit (BBU) 223 and a signal transmission interface 224. The power supply 222 and the BBU 223 may share the power transmission interface 221 and the signal transmission interface 224.

The power transmission interface 221 is for connecting the power supply 222 and the BBU 223 in parallel. The power transmission interface 221 is realized by such as a circuit transmission line or a power bus. The signal transmission interface 224 is electrically connected to the motherboard 21, the power supply 222 and the BBU 223. The signal transmission interface 224 transmits signals between the motherboard 21 and the power supply 222 and the BBU 223.

The power supply 222 converts an AC power VAC into a DC power VDC and then outputs the DC power to the motherboard 21 via the power transmission interface 221. The BBU 223 provides parallel or redundant power to the motherboard 21 via the power transmission interface 221. The BBU 223 and the power supply 222 have the same size and can replace with each other. Thus, the server power system 22 possesses the functions of uninterruptible power supply (UPS) and redundant power.

The server rack comprises a number of power supply slots 231 of the same size. The user may use a part of the power supply slots 231 for accommodating the power supply 222, and use other power supply slots 231 for accommodating the BBU 223.

Figure 4:
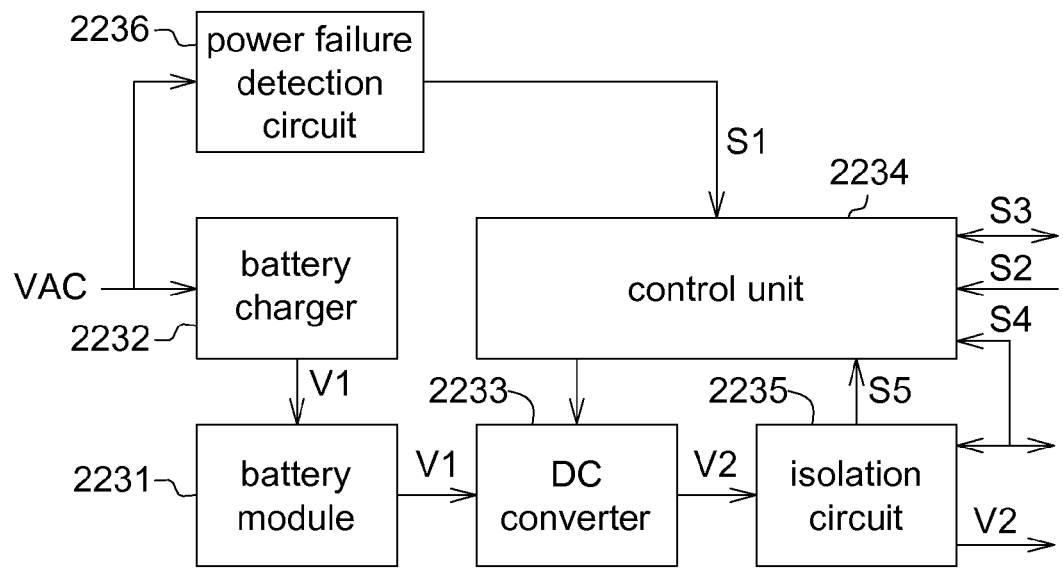
FIG. 4 shows a schematic diagram of a BBU according to a first embodiment.

Referring to both FIG. 3 and FIG. 4. FIG. 4 shows a schematic diagram of a BBU according to a first embodiment. The disclosed BBU 223 is exemplified by the BBU 223a in the first embodiment. When abnormality occurs to the power supply 222, the BBU 223a is activated to provide a redundant power to the motherboard 21. Abnormality of the power supply 222 has many scenarios. For example, the power supply 222 breaks down and makes the power supply 222 disconnected. Or, the power line comes off the connection and makes the power supply 222 disconnected.

The BBU 223a comprises a battery module 2231, a battery charger 2232, a DC converter 2233, a control unit 2234, an isolation circuit 2235 and a power failure detection circuit 2236. The control unit 2234 is implemented by such as a microcontroller and an electrically-erasable programmable read-only memory (EEPROM). The isolation circuit 2235 is implemented by such as an ORing FET and a current sharing circuit.

In order to activate the BBU 223a, the power failure detection circuit 2236 detects whether the AC power is disconnected, and generates a power failure signal S1 to inform the control unit 2234 to start up the BBU if the AC power VAC is disconnected. After the BBU 223a is started up, the control unit 2234 controls the battery charger 2232 to provide a charging voltage V1 to charge the battery module 2231 according to the AC power VAC.

The control unit 2234 controls the DC converter 2233 to convert the charging voltage V1 outputted from the battery module 2231 into a backup power V2. When abnormality occurs to the power supply 222, the isolation circuit 2235 provides the backup power V2 to the motherboard 21 as a redundant power. The isolation circuit 2235 not only generates a current sharing signal S4 to the control unit 2234 but also detects the voltage on the power transmission interface 221 so s to generate an output voltage detection signal S5 to the control unit 2234.

It is noted that, the mechanism for determining whether an abnormality has occurred in the power supply 222 is not limited to the power failure detection circuit 2236. In general, when an abnormality occurs in the power supply 222, the power supply 222 generates an AC OK signal S2. The control unit 2234 may perform the starting up according to the AC OK signal S2. The AC OK signal S2 may be directly transmitted to the BBU 223a via the power supply 222. Or, the power supply 222 transmits the AC OK signal S2 to the motherboard 21 first, and then the motherboard 21 transmits the AC OK signal S2 to the BBU 223a.

In the above mechanism, an AC OK signal S2 is generated when the power failure detection circuit 2236 determines that the power supply is disconnected. Meanwhile, the motherboard 21 may generate a control signal S3, and the control unit 2234 performs the starting up according to the control signal S3. The control signal S3 is transmitted by such as an I2C bus.

Second Embodiment

Figure 5:
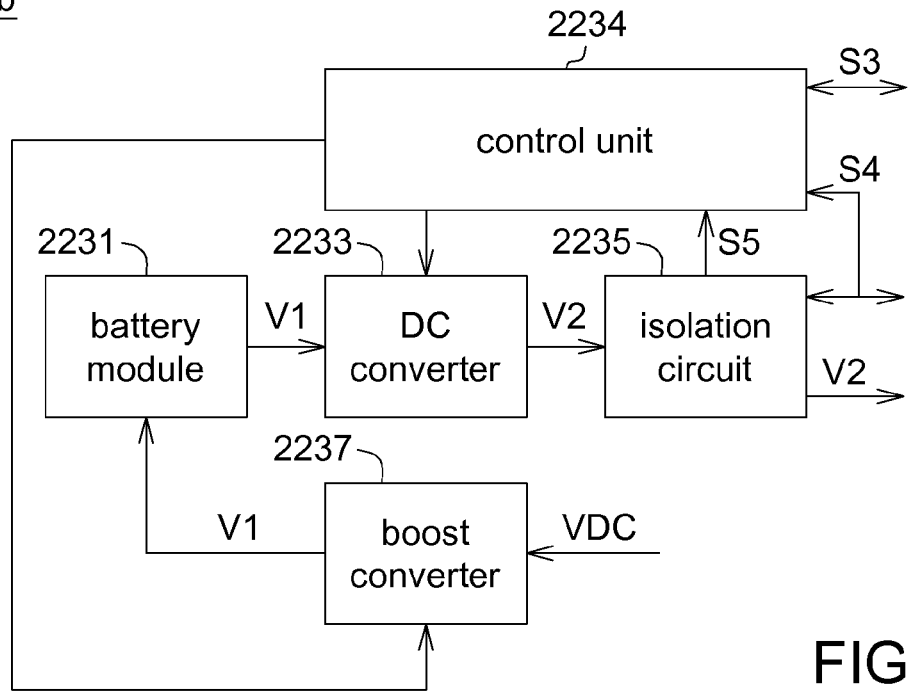
FIG. 5 shows a schematic diagram of a BBU according to a second embodiment.

Referring to both FIG. 3 and FIG. 5. FIG. 5 shows a schematic diagram of a BBU according to a second embodiment. The disclosed BBU 223 is exemplified by a BBU 223b in the second embodiment. When the BBU 223b is already started up and operated in a power saving mode, the BBU 223b determines whether to provide a parallel power to the motherboard 21 according to the voltage of the power transmission interface 221. The BBU 223b comprises a battery module 2231, a DC converter 2233, a control unit 2234, an isolation circuit 2235 and a boost converter 2237. The boost converter 2237 converts a DC power VDC into a charging voltage V1 to charge the battery module 2231. The control unit 2234 controls the DC converter 2233 to convert the charging voltage V1 outputted from the battery module 2231 into a backup power V2. When the DC power VDC on the power transmission interface 221 is smaller than backup power V2, the isolation circuit 2235 provides the backup power V2 to the motherboard 21 as a parallel power. It is noted that, the output of the BBU 223b is based on the difference of voltages at the voltages at two ends of the ORing FET of the isolation circuit 2235. When the DC power VDC on the power transmission interface 221 is insufficient, the BBU 223b automatically makes up the voltage difference.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A server system, comprising:
    a motherboard; and
    a server power system, comprising:
        a power transmission interface;
        a power supply used for converting an AC power into a DC power and then outputting the DC power to the motherboard via the power transmission interface;
        a battery backup unit (BBU) used for providing redundant power to the motherboard via the power transmission interface, wherein the BBU and the power supply have the same size, the BBU comprising:
            a battery module;
            a DC converter;
            a control unit used for controlling the DC converter to convert the charging voltage outputted from the battery module into a backup power; and
            an isolation circuit for selectively providing the redundant power from the DC converter at the power transmission interface, wherein when the DC power is smaller than the backup power, the isolation circuit provides the backup power to the motherboard as the redundant power, and wherein the isolation circuit further generates a current sharing signal for the control unit, detects a voltage on the power transmission interface, and generates an output voltage detection signal for the control unit; and
        a signal transmission interface electrically connected to the motherboard, the power supply and the BBU.

2. The server system according to claim 1, further comprising a server rack, which comprises:
    a first power supply slot used for accommodating the power supply; and
    a second power supply slot used for accommodating the BBU, wherein the dimension of the second power supply slot is the same with that of the first power supply slot.

3. The server system according to claim 1, wherein when abnormality occurs to the power supply, the BBU is activated to provide the redundant power to the motherboard.

4. The server system according to claim 3, wherein the BBU further comprises:
    a battery charger used for providing a charging voltage according to the AC power to charge the battery module.

5. The server system according to claim 4, wherein the BBU further comprises:
    a power failure detection circuit used for detecting whether the AC power is disconnected, and generating a power failure signal to inform the control unit to start up the BBU after the AC power is disconnected.

6. The server system according to claim 4, wherein the control unit starts up the BBU according to an AC OK signal generated by the power supply.

7. The server system according to claim 4, wherein the control unit starts up the BBU according to a control signal generated by the motherboard.

8. The server system according to claim 1, wherein the power transmission interface is a power bus.

9. The server system according to claim 1, wherein the power transmission interface is a power transmission line.

10. The server system according to claim 1, wherein:
    the power transmission interface connects the power supply and the BBU in parallel; and
    the signal transmission interface transmits signals between the motherboard, the power supply and the BBU.

* * * * *